US008866561B2

(12) United States Patent
van Bezooijen

(10) Patent No.: US 8,866,561 B2
(45) Date of Patent: Oct. 21, 2014

(54) ADAPTIVE IMPEDANCE MATCHING NETWORK

(75) Inventor: Adrianus van Bezooijen, Molenhoek (NL)

(73) Assignee: Qualcomm Technologies, Inc., San Diego, CA (US)

(*) Notice: Subject to any disclaimer, the term of this patent is extended or adjusted under 35 U.S.C. 154(b) by 679 days.

(21) Appl. No.: 13/201,417

(22) PCT Filed: Feb. 17, 2009

(86) PCT No.: PCT/EP2009/001132
§ 371 (c)(1),
(2), (4) Date: Sep. 28, 2011

(87) PCT Pub. No.: WO2010/094297
PCT Pub. Date: Aug. 26, 2010

(65) Prior Publication Data
US 2012/0007690 A1 Jan. 12, 2012

(51) Int. Cl.
*H03H 7/38* (2006.01)
*H03H 7/40* (2006.01)
(52) U.S. Cl.
CPC .. *H03H 7/38* (2013.01); *H03H 7/40* (2013.01)
USPC .......................................... 333/17.3
(58) Field of Classification Search
USPC ................................. 333/17.3, 32
See application file for complete search history.

(56) References Cited

U.S. PATENT DOCUMENTS

| 2002/0118067 A1 | 8/2002 | Hirayama |
| 2003/0184413 A1 | 10/2003 | Nguyen |
| 2004/0100341 A1 | 5/2004 | Luetzelschwab et al. |
| 2005/0007291 A1 | 1/2005 | Fabrega-Sanchez et al. |
| 2006/0028286 A1 | 2/2006 | Kishimoto et al. |
| 2006/0038632 A1 | 2/2006 | Niu et al. |
| 2012/0119842 A1* | 5/2012 | Gu et al. ...................... 333/17.3 |

FOREIGN PATENT DOCUMENTS

| JP | 61-186028 A | 8/1986 |
| JP | 63-016192 A | 1/1988 |
| JP | 06-090186 A | 3/1994 |
| JP | 2002-252526 A | 9/2002 |
| WO | WO 02/063782 A2 | 8/2002 |
| WO | WO 2006/054246 A1 | 5/2006 |
| WO | WO 2008/087583 A2 | 7/2008 |

OTHER PUBLICATIONS

Klass, M.L., "High Data Rate SHF Communication Receiver," IEEE Transactions on Aerospace and Electronic Systems, vol. AES-2, No. 2, Mar. 1966, pp. 175-186.

(Continued)

*Primary Examiner* — Stephen Jones
(74) *Attorney, Agent, or Firm* — Smith Risley Tempel Santos LLC

(57) ABSTRACT

An adjustable impedance matching network for providing an adjustable matching impedance (Rm) is presented. The matching network includes first and second impedance adjusting circuits. The first impedance adjusting circuit is adapted to adjust the value of an imaginary part of the matching impedance while substantially maintaining the value of a real part of the matching impedance based on frequency information frequency and a target reference value. The second impedance adjusting circuit is adapted to adjust the value of an imaginary part of the matching impedance to be substantially equal to zero based on the frequency information, so as to adjust the real part of the matching impedance to be substantially equal to the target reference value.

20 Claims, 6 Drawing Sheets

(56) References Cited

OTHER PUBLICATIONS

Sun, Y., et al., "Design method for impedance matching networks," IEEE Proceedings—Circuits, Devices and Systems, vol. 143, No. 4, Aug. 1996, pp. 186-194.
Jiang, B., et al., "Energy Scavenging for Inductively Coupled Passive RFID Systems," Instrumentation and Measurement Technology Conference, May 17-19, 2005, Ottawa, Canada, 6 pages.
Kim, J-H., et al., "Design of reconfigurable RF front-end for multistandard receiver using switchable passive networks," Analog Integrated Circuits and Signal Processing, vol. 50, No. 2, Feb. 2007, pp. 81-88.
International Search Report—PCT/EP2009/001132—ISA/EPO—Jul. 15, 2009.

* cited by examiner

ADAPTIVE IMPEDANCE MATCHING NETWORK

This patent application is a national phase filing under section 371 of PCT/EP2009/001132, filed Feb. 17, 2009, which application is hereby incorporated herein by reference.

TECHNICAL FIELD

This invention relates to adaptive impedance matching networks for use in electronic devices and, more particularly, to multi-band adaptive impedance matching networks for use with radio-frequency micro-electromechanical systems devices.

BACKGROUND

Adaptive impedance matching networks are known in the field of electrical and electronic engineering. Such networks may make use of distributed actuation and detection to simplify a control algorithm of the adaptive matching network.

A problem associated with such impedance matching networks is that the impedance matching range may be limited. For example, an impedance matching network may comprise a variable LC-network having a matching range limited by the tuning range of the variable elements (capacitors and/or inductors) and the frequencies of operation.

FIG. 1 is a block diagram of a conventional GSM/UMTS front-end including an adaptive antenna matching network and adaptive load-line. A number of disadvantages are associated with such an arrangement. Impedance tuning range limitation, especially for multi-band operation, is a particular problem.

In other words, the limited tuning range of variable capacitors, and inductors, limits the impedance matching range of a variable network. Further, the range of impedance matching of a variable network is frequency dependent.

Although the Con/Coff ratio of radio-frequency micro-electromechanical systems (RF-MEMS) devices is relatively large, an enhanced matching range still remains desirable because impedance mismatch between electronic devices (i.e., antenna mismatch) can be extreme. In case of load-line adaptation, a large impedance tuning range is desirable because output power levels vary over wide ranges. Additional tuning range may also be required in case of multi-band applications.

SUMMARY OF THE INVENTION

According to the invention, there is provided an adjustable impedance matching network for providing an adjustable matching impedance comprising: first impedance adjusting means adapted to adjust the value of a real part of the matching impedance whilst changing the value of an imaginary part of the matching impedance based on frequency information and a target reference value; and second impedance adjusting means adapted to adjust the value of an imaginary part of the matching impedance to be substantially equal to a predetermined value.

According to another aspect of the invention, there is provided a method of controlling an adjustable impedance matching network for providing an adjustable matching impedance, the method comprising the steps of: adjusting the value of a real part of the matching impedance whilst changing the value of an imaginary part of the matching impedance based on frequency information and a target reference value; and adjusting the value of an imaginary part of the matching impedance to be substantially equal to a predetermined value.

Thus the invention can be used to provide an enhanced impedance matching range at more than one frequency band. Embodiments can be used to compensate for antenna mismatch or to set optimum power transistor load impedance (load-line).

Embodiments of the invention may therefore be used in multi-mode, multi-standard wireless communication devices (e.g., phones, laptops, PDA's, headsets, . . . ) using RF-MEMS, or other tunable elements, for adaptive antenna matching, load-line adaptation and other RF-re-configurable networks.

BRIEF DESCRIPTION OF THE DRAWINGS

Embodiments of the invention will now be described, purely by way of example, with reference to the accompanying drawings, in which.

Like reference numerals refer to like elements throughout.

DETAILED DESCRIPTION OF ILLUSTRATIVE EMBODIMENTS

Embodiments exploit properties of an impedance network so that requirements on a capacitance tuning range are relaxed. This is achieved by using a frequency-band dependent criterion for controlling the real part of the matching impedance. In other words, the real part of a matching impedance is matched to target value based on a frequency of operation. The frequency of operation is used to determine the most appropriate compensation method, thereby relaxing component requirements, such as a required Cmin/Cmax ratio for a variable capacitor.

An extra degree of freedom is obtained when the control criterion adapting the matching network is made frequency-band dependent.

Figure 1:
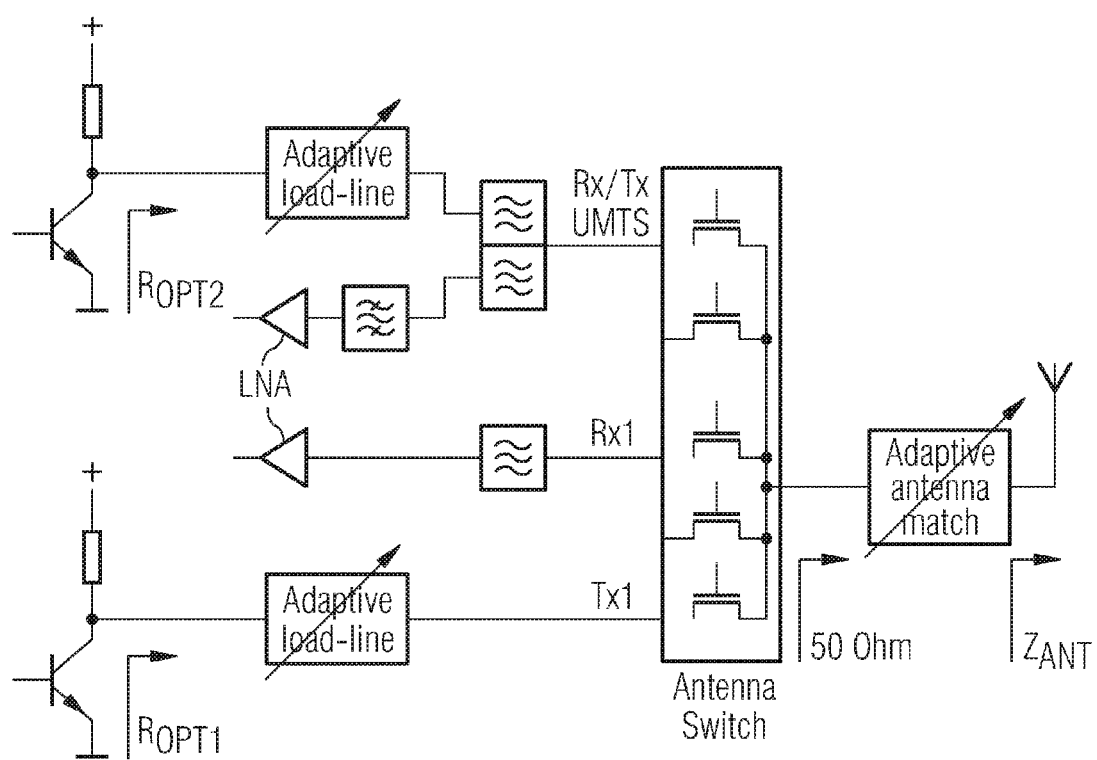
FIG. 1 is a block diagram of a conventional GSM/UMTS front-end including an adaptive antenna matching network and adaptive load-line.
Figure 2A:
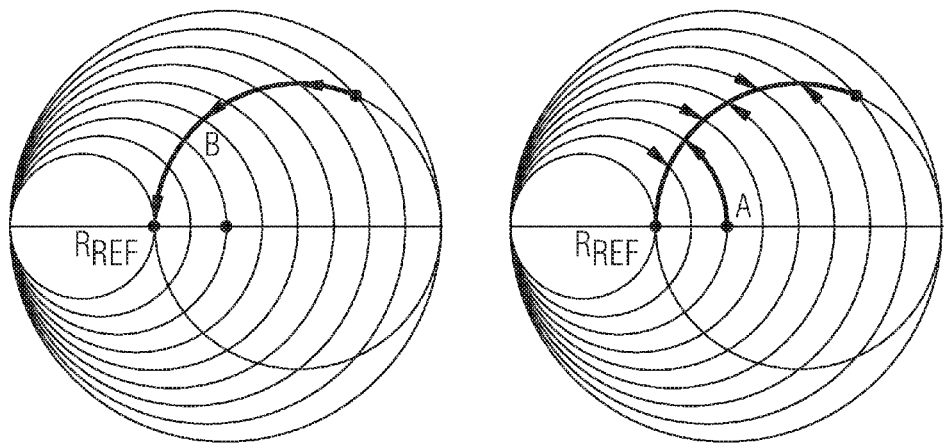
FIGS. 2a and 2b are Smith charts illustrating a method of controlling an adjustable impedance matching network according to an embodiment of the invention.
Figure 2B:
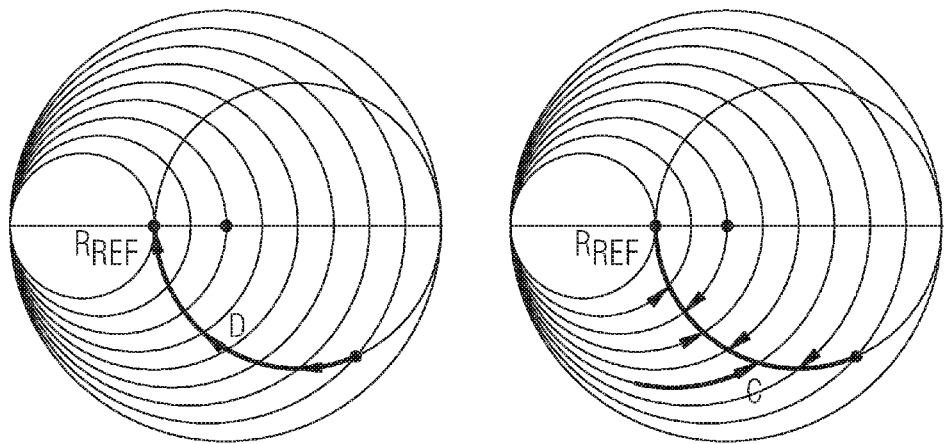

Matching the real part of the impedance may be done via a rotation over a circle segment of constant conductance using a parallel LC network, either to the inductive or capacitive side of the Smith chart as is shown in FIGS. 2a and 2b. The most appropriate side of the Smith chart depends on the frequency of operation.

In mid-frequency range (mid position) of a variable capacitor, a shunt LC-network behaves inductive at the low-frequency bands and capacitive at the high-frequency bands. Less impedance transformation is needed when matching of the real part of an impedance is undertaken via the inductive side of the Smith chart at low-frequency bands and via the capacitive side of the Smith chart at high-frequency bands.

As illustrated in the right hand Smith Chart of FIG. 2a, for low-frequency bands, the value of a real part of the matching impedance Rm is adjusted in the inductive (upper) side of a Smith chart whilst substantially changing/affecting the value of an imaginary part of the matching impedance (Xm). When visualized on the Smith chart, such an adjustment is seen as a rotation in the upper (inductive) half of the Smith chart along a line of constant conductance, as illustrated by arrow A, for example.

Conversely, as shown in right hand Smith Chart of FIG. 2b, for high-frequency bands, the value of a real part of the matching impedance Rm is adjusted in the capacitive (lower) side of a Smith chart whilst substantially changing/affecting the value of an imaginary part of the matching impedance (Xm). When visualized on a Smith chart, such adjustment is seen as a rotation in the lower (capacitive) half of the Smith chart along a line of constant conductance, as illustrated by arrow C for example.

It will be understood that after such adjustment (rotation over a segment of the Smith chart), the matching impedance has a non-zero imaginary part (since it is not on the horizontal axis of the Smith chart). This resulting imaginary part of the impedance is tuned out (i.e. adjust to be equal to zero) by using a series-LC network having a variable series capacitor for example.

The series-LC network will behave capacitive at low frequency bands and inductive at high frequency bands. Consequently, at low frequency bands the series-LC network is most suited to compensate inductive impedances, whilst the series-LC network is most suited to compensate capacitive impedance at high frequency-bands. A relatively large part of the Smith chart can therefore be covered with limited tuning range of the capacitors at more than one frequency band.

For example, as illustrated in the left hand Smith Chart of FIG. 2a, for low-frequency bands, the value of an imaginary part of the matching impedance (Xm) is adjusted in the inductive side of the Smith chart so as to be substantially equal to zero, thereby maintaining the real part of the matching impedance (Rm) to be substantially equal to the target reference value (Rref). When visualised on the Smith chart, such an adjustment is seen as a rotation, over a circle segment of constant resistance, in the upper half of the Smith chart along, as illustrated by arrow B for example.

Conversely, as shown in left hand Smith Chart of FIG. 2b, for high-frequency bands, the value of an imaginary part of the matching impedance (Xm) is adjusted in the capacitive side of the Smith chart so as to be substantially equal to zero, thereby maintaining the real part of the matching impedance (Rm) to be substantially equal to the target reference value (Rref). When visualised on the Smith chart, such an adjustment is seen as a rotation in the lower half of the Smith chart along, as illustrated by arrow D for example.

To ensure that a control loop adapts the impedance via the appropriate side of the Smith chart, information regarding the sign/polarity of (Xm) may be used to control the loop and enforce it in the right direction if necessary.

As explained above, the most appropriate side of the Smith Chart depends on the frequency band of operation. Thus, information relating to the operating frequency, and more particularly to the frequency band of operation, can be used to set the direction of enforcing (i.e. the half of the Smith chart in which the impedance is adjusted).

On the inductive side of the Smith chart, the sign of the loop-gain is opposite to that on the capacitive side of the Smith chart. The frequency information can thus be used to set the sign of a loop-gain in order to ensure proper convergence of the loop to a required solution.

Figure 3A:
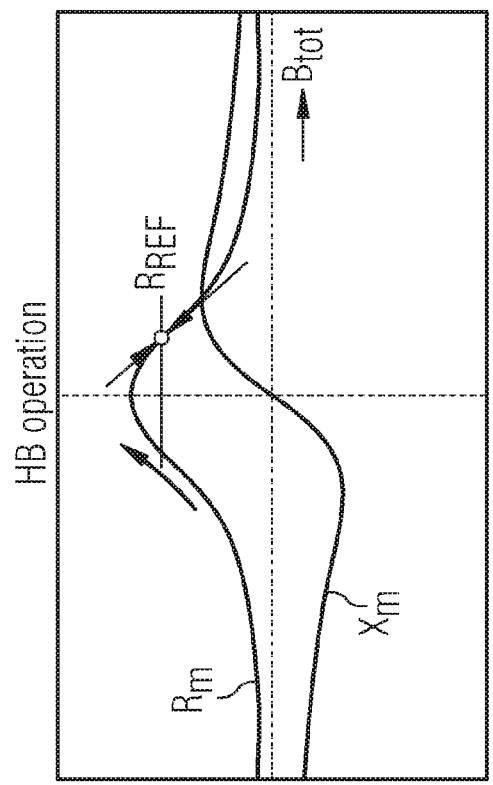
FIG. 3a is a graph illustrating the relationship of matched impedance Rm and reactance Xm to susceptance Btot for low frequency band operation.
Figure 3B:
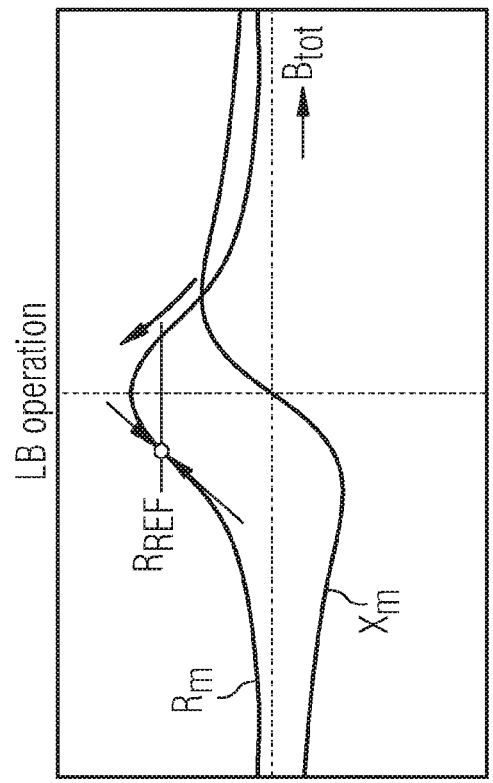
FIG. 3b is a graph illustrating the relationship of matched impedance Rm and reactance Xm to susceptance Btot for high frequency band operation.

In FIGS. 3a and 3b it is illustrated that the real part of the matching impedance (RM) can be obtained at either a positive or negative value of susceptance (Btot), because, due to a quadratic relationship, two solutions exist. However, using the sign of the matched reactance (Xm) one can distinguish the solutions.

Because (Rm) is always positive (for physical reasons), the sign/polarity of Xm is equal to the sign/polarity of the phase of the impedance (Zm) at the intermediate node, where detection is done.

The gradient or slope d(Rm)/d(Btot) around operation point of the matching impedance Rm is different per side of the graph (i.e., the sign of the matched reactance Xm). Thus, the sign of the gradient or gain is different for low-frequency band operation and high-frequency band operation.

If, for Low-frequency band operation, the value of susceptance Btot is positive (i.e., capacitive) it is desired to force the control loop to a negative value of susceptance Btot (i.e., inductive). Conversely, if, for High-frequency band operation, the value of susceptance Btot is negative (i.e., inductive), it is desired to force the control loop to a positive value of susceptance Btot (i.e., capacitive).

Figure 4A:
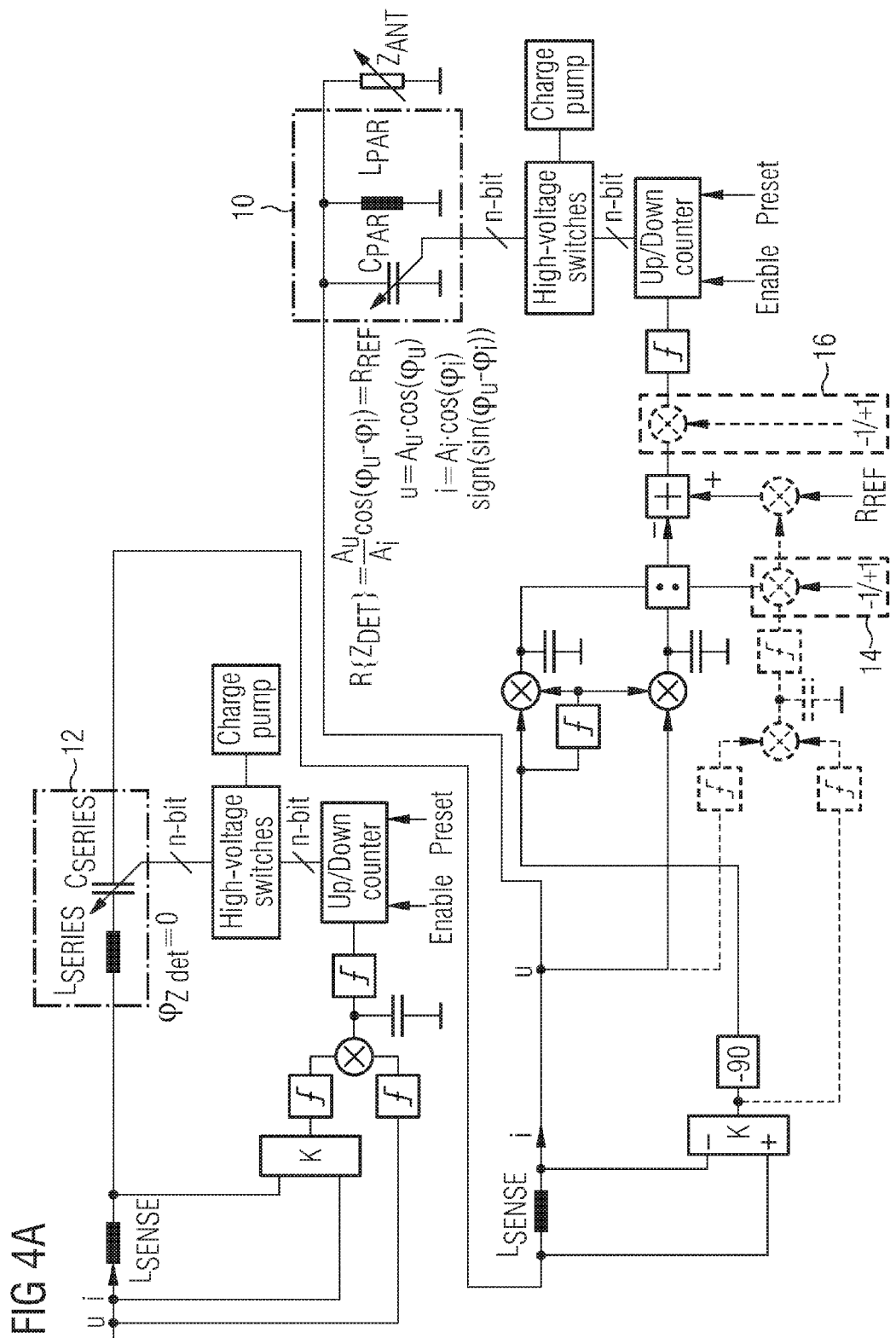
FIG. 4a is a block diagram of an adjustable impedance matching network according to an embodiment of the invention.

A block diagram of an adjustable impedance matching network according to an embodiment of the invention is shown in FIG. 4a.

In time division multiple access (TDMA) reception-mode (Rx-mode), no signal is available for adaptation. Using stored transmission-mode (Tx-mode) settings is sub-optimal because of differences in frequency between the transmission (Tx) band and reception (Rx) band.

In code division multiple access (CDMA) mode, Rx and Tx occur at the same time at different frequencies. As adaptation occurs in the Tx-band, sub-optimal performance at Rx can be expected.

Band switching, which may, for instance, be needed for a hand-over between devices, requires a new iteration to an optimum.

In idle-mode, a transmitter is only occasionally on for a short period of time. In-between these "on" periods, large antenna impedance variations may occur.

These problems can better be coped with when a priori knowledge (from base-band controller) is used to pre-set, offset, or detune the matching network, which can easily be done when the algorithm is implemented in software.

The embodiment of FIG. 4a presumes a stand-alone adaptive network fully hardware implemented.

A parallel LC network for adjusting the value of a real part (Rm) of the matching impedance whilst changing the value of an imaginary part (Xm) of the matching impedance is indicated by the dotted box labeled "10".

A series LC network for tuning out an imaginary part (Xm) of the impedance is indicated by the dotted box labeled "12".

To obtain the frequency-band dependent control criterion, first multiplier 14 and second multiplier 16 (or Exclusive-OR logic units in digital domain) are included in the network, as indicated in dotted boxes. These multipliers are adapted to set the sign of the control loop as a function of low/high-frequency band information.

The first multiplier 14 is arranged to reverse the sign of the reference value to the loop controls. It provides a strong push in the appropriate direction when needed. The second multiplier 16 is arranged to reverse the sign of the error signal of the control loop so as to set the slope of the gain.

The phase of the impedance (Zm) is given by the phase difference between the phase of the nodal voltage u and the phase of branch current i. This phase difference is determined with the dotted mixer, at the left of the smoothing capacitor that used limiters at both inputs. The SIGN is determined with the dotted limiter drawn in between this smoothing capacitor and first multiplier 14.

The variable capacitors Cpar and Cseries are implemented as switched capacitor arrays of RF-MEMS devices. Their high-voltage biasing (60/30V) is generated with a charge-pump from a 3.5V supply voltage.

Alternatively, (BST) varactors, or fixed capacitors with CMOS or pHEMT RF-switches can be used.

Figure 4B:
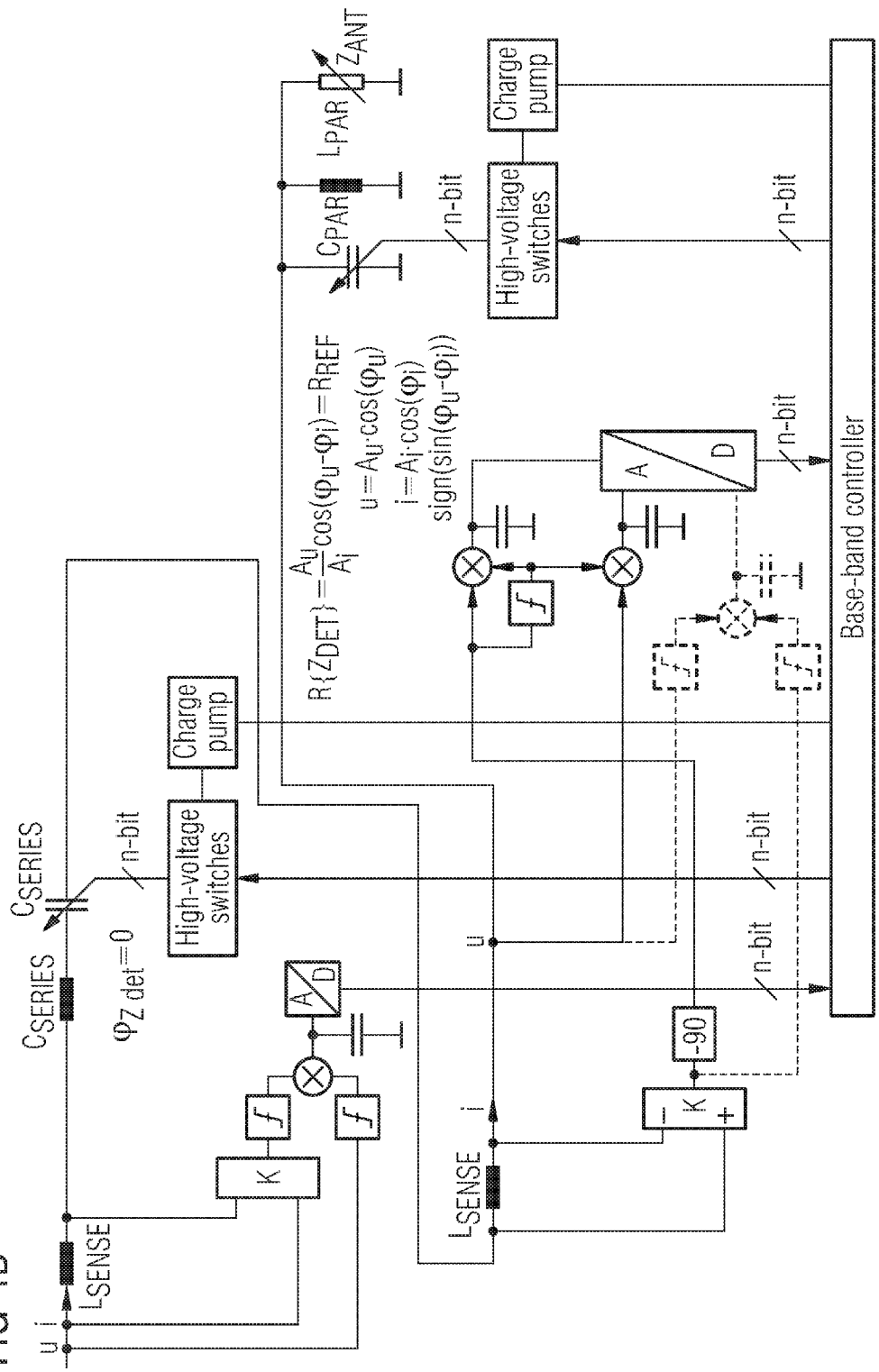
FIG. 4b is a block diagram of an adjustable impedance matching network according to an alternative embodiment of the invention.

Alternative implementations can make use, for instance, of base-band signal processing. Such an alternative embodiment is illustrated in FIG. 4b. These alternative implementations can, for instance, make use of A-to-D converters to convert detected information into the digital domain for further signal processing.

Figure 5:
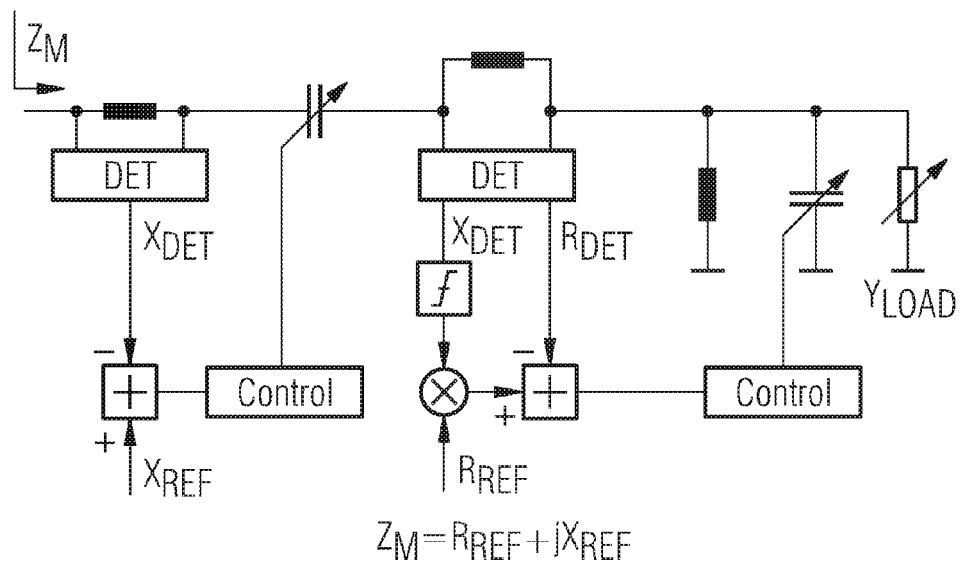
FIG. 5 is a block diagram of an adjustable impedance matching network according to yet another embodiment of the invention.

It will be understood that the embodiments of FIGS. 4a and 4b are adapted to adjust the value of the imaginary part (Xm) of the matching impedance (Zm) to be substantially equal to zero. In other embodiments, however, the value of the imaginary part (Xm) of the matching impedance (Zm) may be adjusted to be substantially equal to a predetermined reference value (Xref), similar to the adjustment of the real part to a target reference value (Rref). Once such embodiment is shown in FIG. 5 (in which dual-band control criterion are not catered for).

Figure 6:
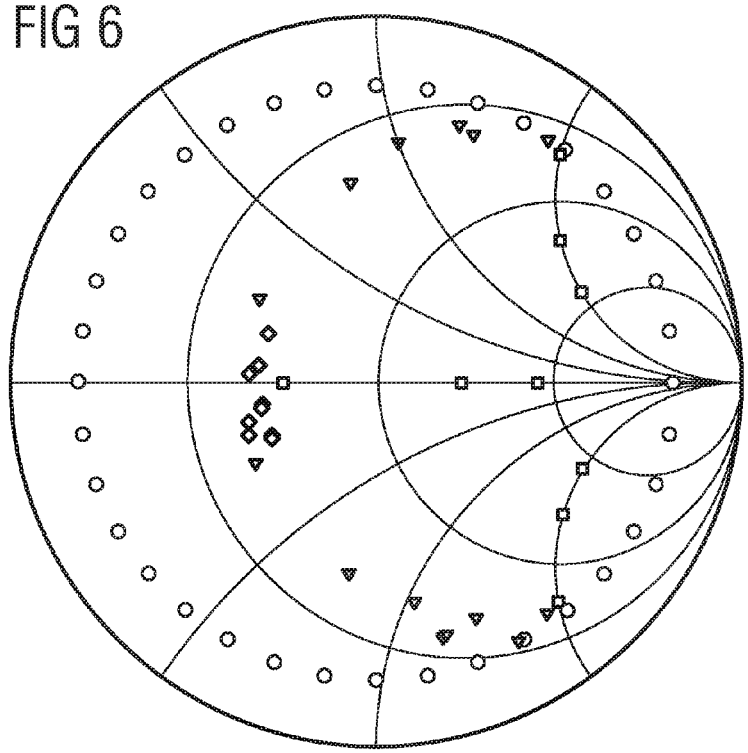
FIG. 6 is Smith chart illustrating simulation results for an adjustable impedance matching network according to an embodiment of the invention.

In FIG. 6, simulation results for an adjustable impedance matching network according to an embodiment of the invention are illustrated on a Smith chart. At 900 MHz and 1800 MHz load impedances of 30, 80, 130+j (−100, 0, 100) (squares) are adapted to a target reference value (Rref) of approximately 25 ohms (diamonds) via the inductive (triangles in the upper half of the Smith Chart) and capacitive side (triangles in the lower half of the Smith Chart) respectively.

It should be noted that the above-mentioned embodiments illustrate rather than limit the invention, and that those skilled in the art will be capable of designing many alternative embodiments without departing from the scope of the invention as defined by the appended claims.

For example, frequency changes can be catered for in two ways:

1. Pre-setting of the variable capacitors can be done from factory calibration data per frequency sub-band; or
2. Pre-setting can be done from recently obtained adaptation data per frequency sub-band, combined with system data on frequency band changes.

In the first case the adaptation loop can be closed locally and pre-setting may be used to define a capacitor values as initialization of the adaptation.

In the second case adaptation information can be stored and regularly updated by the base-band controller. Therefore, the adaptation loop can be closed via the base-band controller. Self-learning software algorithms can be used to determine optimum initialization values for the capacitors. During reception, the control signal of the capacitors can be provided with an offset with respect to the value found adaptively during transmission.

It will also be understood a divider in an embodiment of an adjustable impedance matching network can, alternatively, be implemented as a subtraction in the logarithmic-domain.

Embodiments could also be implemented with (BST) varactors or with fixed capacitors using RF-switches implemented in SOI (Silicon-On-Insulator) CMOS or pHEMT technology.

The above embodiments, and accompanying FIGS. 2-6, have referred to down-converting impedance networks. It will therefore be understood that a similar approach for adapting impedance may be used for an up-converting impedance network (i.e., the input and output being swapped).

The invention claimed is:

1. An adjustable impedance matching network for providing an adjustable matching impedance, the matching network comprising:
   a first impedance adjusting circuit configured to adjust the value of a real part of the matching impedance whilst changing the value of an imaginary part of the matching impedance based on frequency information and a target reference value; and
   a second impedance adjusting circuit configured to adjust the value of the imaginary part of the matching impedance to be substantially equal to a predetermined value.

2. The matching network according to claim 1, wherein the pre-determined value is equal to zero.

3. The matching network according to claim 1, wherein the first impedance adjusting circuit comprises a parallel LC network.

4. The matching network according to claim 1, wherein the second impedance adjusting circuit comprises a series LC network.

5. The matching network according to claim 1, wherein at least one of the first and second impedance adjusting circuits comprises a switched capacitor array of RF-MEMS devices.

6. The matching network according to claim 1, wherein the frequency information comprises information indicative of a frequency band of operation.

7. The matching network according to claim 6, wherein the first and second impedance adjusting circuits are adapted to adjust the value of the matching impedance in the inductive region of a Smith chart if the frequency information is indicative of a low-frequency band, and to adjust the value of the matching impedance in the capacitive region of the Smith chart if the frequency information is indicative of a high-frequency band.

8. An electronic device comprising an adjustable impedance matching network according to claim 1.

9. The electronic device according to claim 8, further comprising an antenna adapted to transmit signals to and receive signals from a wireless communications unit, wherein the target reference value substantially matches an impedance of the antenna.

10. An adjustable impedance matching network for providing an adjustable matching impedance, the matching network comprising:
    first impedance adjusting means for adjusting the value of a real part of the matching impedance whilst changing the value of an imaginary part of the matching impedance based on frequency information and a target reference value; and
    second impedance adjusting means for adjusting the value of the imaginary part of the matching impedance to be substantially equal to a predetermined value.

11. The matching network according to claim 10, wherein the first impedance adjusting means comprises a parallel LC network and wherein the second impedance adjusting means comprises a series LC network.

12. The matching network according to claim 10, wherein at least one of the first and second impedance adjusting means comprises a switched capacitor array of RF-MEMS devices.

13. A method of controlling an adjustable impedance matching network for providing an adjustable matching impedance, the method comprising:
   adjusting the value of a real part of the matching impedance whilst changing the value of an imaginary part of the matching impedance based on frequency information and a target reference value; and
   adjusting the value of the imaginary part of the matching impedance to be substantially equal to a predetermined value.

14. The method according to claim 13, wherein the predetermined value is equal to zero.

15. The method according to claim 13, wherein adjusting the value of a real part of the matching impedance whilst changing the value of an imaginary part of the matching impedance comprises modifying a parameter of a least one component of a parallel LC network.

16. The method according to claim 13, wherein adjusting the value of the imaginary part of the matching impedance to be substantially equal to a predetermined value comprises modifying a parameter of at least one component of a series LC network.

17. The method according to claim 13, wherein the frequency information comprises information indicative of a frequency band of operation.

18. The method according to claim 13, wherein adjusting the value of an imaginary part of the matching impedance comprises adjusting the value of the matching impedance in the inductive region of a Smith chart if the frequency information is indicative of a low-frequency band, and adjusting the value of the matching impedance in the capacitive region of the Smith chart if the frequency information is indicative of a high-frequency band.

19. A computer configured to operate a computer program comprising software configured to perform all of the steps of claim 10, when said program is run on computer.

20. The computer as claimed in claim 19, further comprising a computer readable medium, wherein the computer program is stored on the computer readable medium.

* * * * *